United States Patent
Tseng et al.

(10) Patent No.: US 9,349,815 B2
(45) Date of Patent: May 24, 2016

(54) SEMICONDUCTOR STRUCTURE AND A FABRICATING METHOD THEREOF

(71) Applicant: UNITED MICROELECTRONICS CORP., Hsin-Chu (TW)

(72) Inventors: Kuan-Yi Tseng, Tainan (TW); Tzu-Ping Chen, Hsinchu County (TW); Chun-Lung Chang, Yilan County (TW); Chih-Haw Lee, New Taipei (TW); Wei-Shiang Huang, Taichung (TW); Chien-Hung Chen, Hsin-Chu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 1 day.

(21) Appl. No.: 14/488,295

(22) Filed: Sep. 17, 2014

(65) Prior Publication Data

US 2016/0079380 A1    Mar. 17, 2016

(51) Int. Cl.
| H01L 21/336 | (2006.01) |
| H01L 29/423 | (2006.01) |
| H01L 29/78  | (2006.01) |
| H01L 29/66  | (2006.01) |

(52) U.S. Cl.
CPC .... *H01L 29/42368* (2013.01); *H01L 29/66575* (2013.01); *H01L 29/78* (2013.01)

(58) Field of Classification Search
CPC .............. H01L 29/42368; H01L 29/78; H01L 29/66575
USPC ................... 438/197, 280; 257/288, 327, 401
See application file for complete search history.

(56) References Cited

U.S. PATENT DOCUMENTS

| 6,087,237 | A | 7/2000 | Hwang | |
| 7,253,470 | B1* | 8/2007 | Liu et al. | 257/316 |
| 7,432,156 | B1* | 10/2008 | Lee et al. | 438/260 |
| 7,691,691 | B1* | 4/2010 | Cleeves | 438/163 |
| 2004/0183106 | A1* | 9/2004 | Kim et al. | 257/239 |
| 2005/0282338 | A1* | 12/2005 | Yoo et al. | 438/257 |
| 2013/0134497 | A1* | 5/2013 | Yan et al. | 257/324 |

* cited by examiner

*Primary Examiner* — Kimberly Rizkallah
*Assistant Examiner* — Maria Ligai
(74) *Attorney, Agent, or Firm* — Winston Hsu; Scott Margo

(57) ABSTRACT

A gate structure is provided. The gate structure includes a substrate, a gate disposed on the substrate and a gate dielectric layer disposed between the substrate and the gate, wherein the gate dielectric layer is in the shape of a barbell. The barbell has a thin center connecting to two bulging ends. Part of the bulging ends extends into the gate and the substrate.

8 Claims, 3 Drawing Sheets

SEMICONDUCTOR STRUCTURE AND A FABRICATING METHOD THEREOF

BACKGROUND OF THE INVENTION

1. Field of the Invention

The present invention relates to a semiconductor structure and a fabricating method thereof, and more particularly, to a semiconductor structure which can prevent gate-induced drain leakage (GIDL), and a fabricating method thereof.

2. Description of the Prior Art

In the fabrication of integrated circuits, the trend of scaling down the sizes of semiconductor devices such as MOS transistors leads to performance issues regarding the current driving capabilities of these devices. Since the current driving capability is a function of both source resistance and gate oxide thickness, better performance in these devices is achievable through a thinner gate dielectric layer and spacers. It has been observed, however, that as the gate dielectric layer is made thinner, gate-induced drain leakage (GIDL) currents occurs.

GIDL currents degrade the performance of transistors, meaning that the GIDL currents become a larger percentage of the total sub-threshold leakage current.

Thus, difficulties exist in providing a scaled down semiconductor device having a suitable balance between high current driving capability and low GIDL current.

SUMMARY OF THE INVENTION

The present invention provides a method to produce a transistor having a lower gate induced drain leakage.

According to the claimed invention, a method of fabricating a gate structure is provided. The method first forms a gate and a dielectric layer on a substrate, wherein the dielectric layer is disposed between the gate and the substrate. Then, part of the dielectric layer is removed to form two recesses, wherein each of the recesses is defined by concentration of etchant. Finally, a first oxide formation process is performed to transform the gate, the dielectric layer and the substrate defining the recesses into a first silicon oxide layer, meanwhile, the first oxide formation process is used to extend side wall oxide by a thermal oxidation.

According to the claimed invention, a gate structure is provided. The gate structure includes a substrate, a gate disposed on the substrate and a gate dielectric layer disposed between the substrate and the gate, wherein the gate dielectric layer is shaped like a barbell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
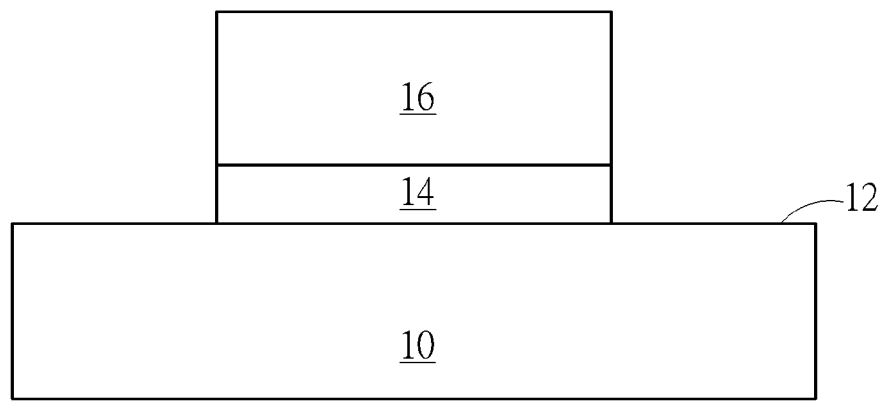
FIGS. 1-5 are drawings illustrating a method of fabricating a semiconductor structure according to a preferred embodiment of the present invention.

FIGS. 1-5 are drawings illustrating a method for fabricating a semiconductor structure according to a preferred embodiment of the present invention. FIG. 6 is a drawing illustrating a MOS transistor according to a preferred embodiment of the present invention. As shown in FIG. 1, a substrate 10 is provided. The substrate 10 has a top surface 12. The substrate 10 may include, but is not limited to, silicon substrate, gallium arsenide (GaAs) substrate, silicon on insulator layer (SOI) substrate, epitaxial substrate, silicon germanium substrate, or any other common semiconductor material substrate. According to a preferred embodiment, the substrate 10 includes silicon-containing material, such as polysilicon. Subsequently, a dielectric layer 14 and a gate 16 are sequentially formed on the top surface 12 of the substrate 10 by performing a deposition step and a patterning step. The top surface 12 contacts the dielectric layer 14. The dielectric layer 14 preferably includes silicon oxide or other material suitable for a dielectric layer. The gate 16 includes polysilicon or other material suitable for conductive layers.

Figure 2:
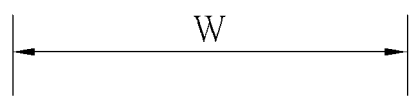
Figure 2:
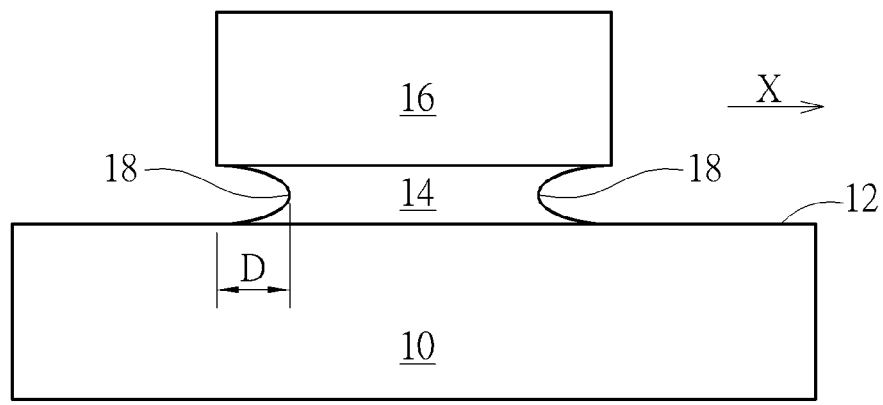

Refer to FIG. 2. An etching process is performed to remove part of the dielectric layer 14 between the gate 16 and the substrate 10, and then two recesses 18 are formed which extend into the dielectric layer 14. Specifically, the two recesses 18 are defined by part of the gate 16, part of the dielectric layer 14 and part of the substrate 10.

Each recess 18 has a depth D extending in a horizontal direction X. The horizontal direction X is parallel to the top surface 12 of the substrate 10. The gate 16 has a width W which also extends in the horizontal direction X. A ratio of the depth D to the width W is preferably 1:7. Because the recesses 18 are formed by the etching process, the depth of the recesses 18 can be controlled by concentration of etchant.

According to a preferred embodiment of the present invention, the etching process is a wet etching process. Furthermore, an etchant used in the etching process includes etching rates which are substantially different for polysilicon and silicon oxide. Therefore, only part of the dielectric layer 14 is removed during the etching process. The gate 16 and the substrate 10 retain their respective profiles.

Figure 3:
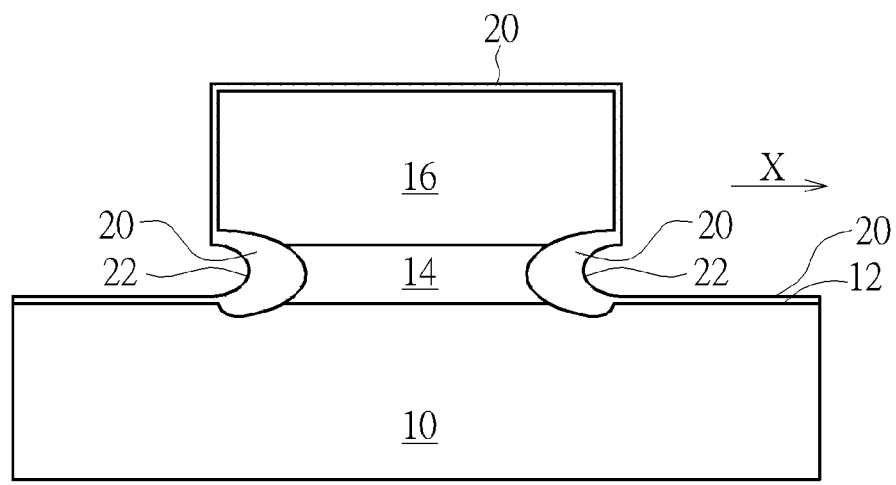

As shown in FIG. 3, a first oxide formation process is performed. The first oxide formation process can be a rapid thermal oxidation process or be performed in a furnace, but is not limited to this. Because the gate 16 and the substrate 10 include silicon, part of the gate 16 and the substrate 10 are oxidized during the first oxide formation process and thus a first silicon oxide layer 20 is formed. It is noteworthy that the gate 16, the dielectric layer 14 and the substrate 10 defining the recesses 18 are oxidized. The first silicon oxide layer 20 incorporates silicon consumed from the substrate 10, the dielectric layer 14, the gate 16 and oxygen supplied from the ambient. Thus, the first silicon oxide layer 20 grows both into the substrate 10, the dielectric layer 14 and gate 16 and out of them. More specifically, the first silicon oxide layer 20 is formed in the recesses 18 (refer to FIG. 2 for the position of recesses 18), extends into the gate 16, the substrate 10, and the dielectric layer 14 and covers the gate 16 and the top surface 12 of the substrate 10. According to a preferred embodiment of the present invention, the first silicon oxide layer 20 in the recesses 18 has an exposed concave bottom 22. The concave bottom 22 is overlapped by the gate 16. The first silicon oxide layer 20 contacts the dielectric layer 14.

Figure 4:
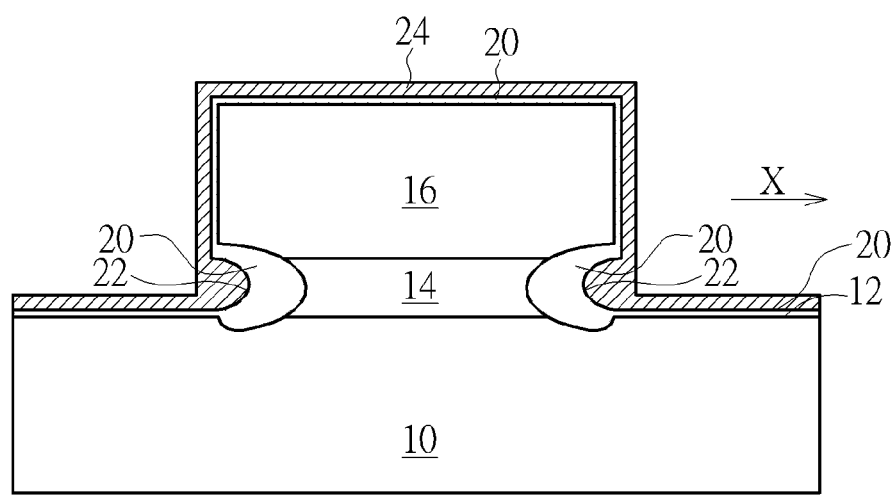

As shown in FIG. 4, a second oxide formation process is performed to form a second silicon oxide layer 24 which fills the concave bottom 22 and covers the first silicon oxide layer 20. The second oxide formation process may be a chemical vapor deposition or an oxidation process. The second silicon oxide layer 24 may be a high temperature oxide layer formed by a high temperature oxidation process or by an in-situ steam generation process. More specifically, the second silicon oxide layer 24 covers the top surface 12 of the substrate 10 and the gate 16.

Figure 5:
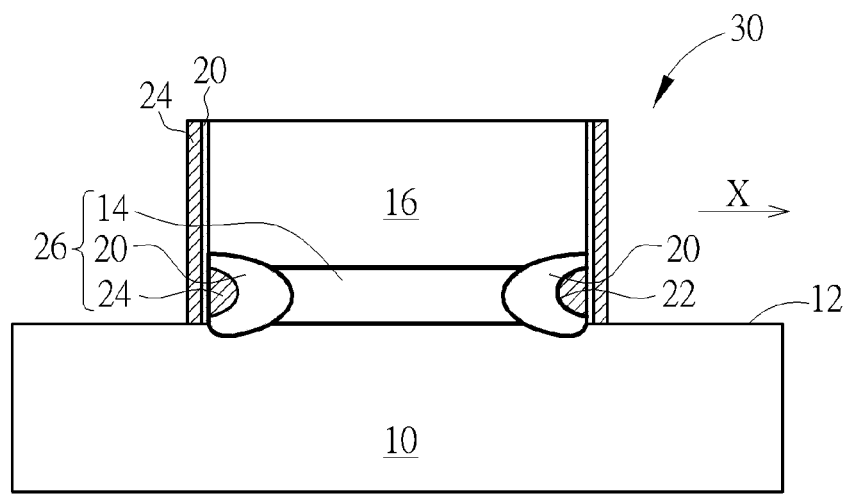
Figure 6:
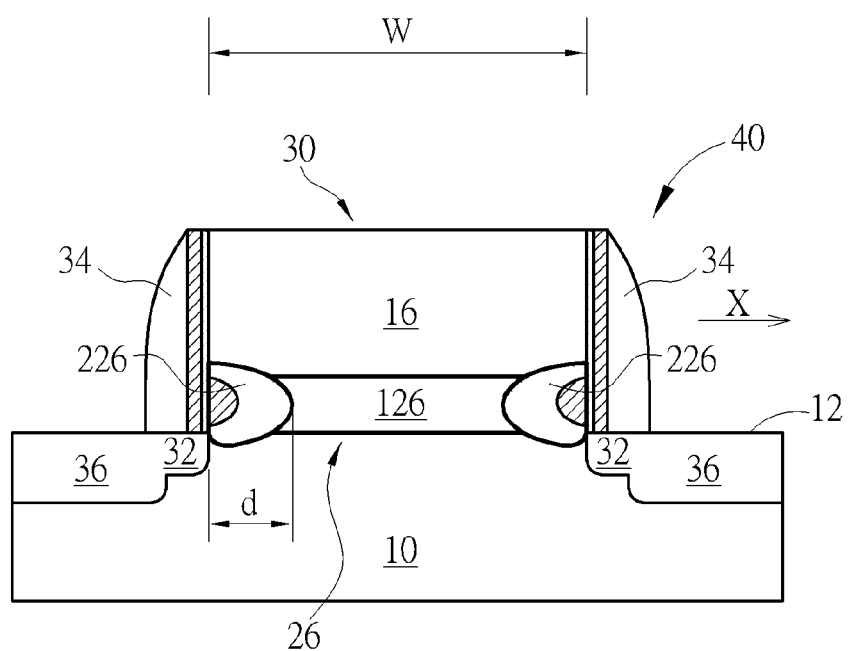
FIG. 6 is a drawing illustrating a MOS transistor according to a preferred embodiment of the present invention.

As shown in FIG. 5, the first silicon oxide layer 20 and the second silicon oxide layer 24 on the top surface 12 which is not under the gate 16 are removed. The first silicon oxide layer 20 and the second silicon oxide layer 24 at two sides of the gate 16 and directly under the gate 16 are remained. At this point, the dielectric layer 14, the first silicon oxide layer 20, and the second silicon oxide layer 24 form a gate dielectric layer 26 (shown in bold line) in a barbell shape. A gate structure 30 of the present invention is completed at this point.

Refer to FIG. 6. After the gate structure 30 is formed, an implantation process is performed to form two lightly doped source/drain regions 32 in the substrate 10 at two sides of the gate 16. A spacer 34 is then formed at two sides of the gate 16. Later, another implantation process is performed to form two source/drain regions 36 in the substrate 10 at two sides of the gate 16. A MOS transistor 40 of the present invention is completed at this point.

According to another preferred embodiment of the present invention, a MOS transistor 40 is provided in the present invention, as shown in FIG. 6. The MOS transistor 40 includes a gate structure 30 and two source/drain regions 36. The spacer 34 can be optionally formed around the gate structure 30.

The gate structure 30 includes a substrate 10 having a top surface 12. According to a preferred embodiment, the substrate 10 includes silicon-containing material, such as polysilicon. A gate 16 is disposed on the top surface 12 of the substrate 10. The gate 16 is preferably polysilicon. A gate dielectric layer 26 (illustrated by a bold line) is disposed between the substrate 10 and the gate 16, and the gate dielectric layer 26 is substantially covered by the gate 16. Specifically, the gate dielectric layer 26 is entirely overlapped by the gate 16. The spacer 34, the substrate 10 and the gate 16 seal the gate dielectric layer 26. In other words, the spacer 34, the substrate 10 and the gate 16 enclose the gate dielectric layer 26.

The gate dielectric layer 26 is preferably made of silicon oxide, but is not limited thereto. It is noteworthy that the gate dielectric layer 26 is in the shape of a barbell. The barbell has a thin center 126 connecting to two bulging ends 226, and part of the bulging ends 226 extend into the gate 16 and the substrate 10. Each of the bulging ends 226 has a depth d in the horizontal direction X, and the gate 16 has a width W which also extends in the horizontal direction X. A ratio of the depth d of the bulging end 226 to the width W of the gate 16 is 1:7.

Because the gate dielectric layer 26 has two bulging ends 226, the gate dielectric layer 26 near the source/drain regions 36 is thicker than the center of the gate dielectric layer 26. By means of the thicker bulging ends 226, the GIDL current can be successfully blocked. The MOS transistor 40 of the present invention is suitable for any transistors having GIDL problem. The MOS transistor 40 of the present invention can especially be applied to select transistors in a nonvolatile memory structure. Because transistors in a nonvolatile memory structure usually need to withstand high voltage, the GIDL problem is more severe. The gate dielectric layer 26 having a barbell shape can effectively prevent the GIDL current from occurring in the high voltage select transistors.

One conventional technique of reducing GIDL is by forming a thick gate dielectric layer. Another approach for reducing GIDL currents involves symmetrical oxidation to provide a thick silicon oxide layer in the regions of the source/drain regions. Because the thickness of the entire gate dielectric layer is increased, however, the operation voltage of the transistor will be changed, which is undesirable. Furthermore, when forming the thick silicon oxide layer on the source/drain regions, the dopants already implanted in the substrate will be further diffused, which will influence the dopant concentration of the source/drain regions. When forming the contact holes above the source/drain regions and the gate, because the silicon oxide layer covers the source/drain regions, the contact hole needs to dig deeper to penetrate the silicon oxide layer and expose the source/drain regions. In this way, the gate will be over-etched during the formation of the contact hole because there is no silicon oxide covering the gate.

The method provided in the present invention can solve the problems occurring in the conventional method, and effectively prevent GIDL.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a semiconductor structure comprising:
    forming a gate and a dielectric layer on a substrate, wherein the dielectric layer is disposed between the gate and the substrate;
    removing part of the dielectric layer to form at least two recesses, wherein each of the recesses is defined by part of the gate, part of the dielectric layer and part of the substrate;
    performing a first oxide formation process to transform the gate, the dielectric layer and the substrate defining the recesses into a first silicon oxide layer; and
    after the first oxide formation process, performing a second oxide formation process to form a second silicon oxide layer filling the recesses and covering the first silicon oxide layer.

2. The fabricating method of a semiconductor structure of claim 1, wherein the two recesses are formed by a wet etch process.

3. The fabricating method of a semiconductor structure of claim 1, wherein the first silicon oxide layer fills the recesses.

4. The fabricating method of a semiconductor structure of claim 1, wherein the first silicon oxide layer extends into the gate, the substrate, and the dielectric layer.

5. The fabricating method of a semiconductor structure of claim 1, wherein the first oxide formation process comprises a rapid thermal oxidation process.

6. The fabricating method of a semiconductor structure of claim 1, wherein the second silicon oxide layer is formed by a high temperature oxidation process or an in-situ steam generation process.

7. The fabricating method of a semiconductor structure of claim 1, wherein the two recesses extend into the dielectric layer, and are covered by the gate.

8. The fabricating method of a semiconductor structure of claim 1, further comprising:
    forming two source/drain regions in the substrate at a side of the gate.

* * * * *